United States Patent
Choi

[19]

[11] Patent Number: 6,091,649
[45] Date of Patent: Jul. 18, 2000

[54] INTEGRATED CIRCUIT MEMORY DEVICES HAVING BUILT-IN SELF TEST BASED REDUNDANCY AND METHODS OF OPERATION THEREOF

[75] Inventor: Yong Jin Choi, Seoul, Rep. of Korea

[73] Assignee: Samsung Electronics Co., Ltd., Rep. of Korea

[21] Appl. No.: 09/173,294

[22] Filed: Oct. 14, 1998

[30] Foreign Application Priority Data

Feb. 6, 1998 [KR] Rep. of Korea ................. 98-3510

[51] Int. Cl.[7] .......................................... G11C 7/00
[52] U.S. Cl. .................................. 365/200; 365/201
[58] Field of Search ............................ 365/200, 201; 371/21.1

[56] References Cited

U.S. PATENT DOCUMENTS

| | | | |
|---|---|---|---|
| 5,659,551 | 8/1997 | Huott et al. ................. | 371/21.1 |
| 5,825,783 | 10/1998 | Momohara .................. | 371/21.1 |
| 5,841,711 | 11/1998 | Watanabe .................. | 365/200 |
| 5,859,804 | 1/1999 | Hedberg et al. .......... | 365/201 |
| 5,864,577 | 6/1998 | Johnston et al. .......... | 365/200 |

*Primary Examiner*—David Nelms
*Assistant Examiner*—Anh Phung
*Attorney, Agent, or Firm*—Myers Bigel Sibley & Sajovec

[57] ABSTRACT

An integrated circuit memory device includes a memory access circuit operative to generate an address. A redundant memory is responsive to the memory access circuit and has a plurality of memory locations, the redundant memory providing access to one of a first memory location and a second memory location responsive to an address generated by the memory access circuit and to a redundancy control signal. A self-testing redundancy control circuit is responsive to the memory access circuit and to the redundant memory and operative to apply a redundancy control signal to the redundant memory in response to a comparison of test data stored in a target memory location of the redundant memory with data retrieved from the target memory location. Related operating methods are also discussed.

13 Claims, 5 Drawing Sheets

INTEGRATED CIRCUIT MEMORY DEVICES HAVING BUILT-IN SELF TEST BASED REDUNDANCY AND METHODS OF OPERATION THEREOF

FIELD OF THE INVENTION

The present invention relates to integrated circuit memory devices and methods of operation thereof, and more particularly, to integrated circuit memory devices having redundant memory locations and methods of operation thereof.

BACKGROUND OF THE INVENTION

A typical integrated circuit memory device includes a very large number of memory locations or "cells" for storing data. For example, conventional integrated circuit memory devices may have more than a 256-Mbit capacity, i.e., may include more than 256 million memory locations. A single defective cell can cause an entire memory device to be rejected as a defective product. Accordingly, memory cell defects can significantly decrease manufacturing yield.

To improve yield, memory integrated circuits commonly include redundant memory cells that can serve as replacements for "normal" cells that are found to be defective. A conventional redundancy control circuit typically includes a redundancy decoder for decoding an input address and for addressing a redundant cell when an address of a defective memory cell is applied to the memory device.

A typical redundancy control circuit includes fuses that control access to redundant memory cells. When a regular memory cell is proved defective in a tests performed after the wafer fabrication process, appropriate fuses are blown such that the redundancy control circuit causes a redundant cell to be accessed in place of the defective memory cell. In this manner, the memory device is "repaired," allowing manufacturing yield to be improved.

Typically, the fuses employed in redundancy control circuits are conductive runs formed of polycrystalline silicon or metal in series with address or data lines. When a defective memory cell is detected, the fuse connecting the cell to an address or date line is cut so that the defective cell is isolated. However, the cutting of the fuse is typically permanent, i.e., once the fuse is cut, the disconnected defective memory cell cannot be reconnected. Also, defects typically are repaired at the wafer stage, when the fuses are accessible. Once the device is packaged, it may be difficult to make additional repairs.

SUMMARY OF THE INVENTION

In light of the foregoing, it is an objective of the present invention to provide integrated circuit memory devices and methods of operation thereof in which repair of a defective memory cell can be achieved in a packaged state.

It is another object of the present invention to provide integrated circuit memory devices and methods of operation thereof in which repair of a defective memory cell can be achieved without wafer stage testing.

It is yet another object of the present invention to provide integrated circuit memory devices and methods of operation thereof which do not require the use of fuses or other devices that have irreversible states.

These and other objects, features and advantages are provided according to the present invention by integrated circuit memory devices and methods of operation thereof in which a redundant memory, i.e., a memory having redundant memory locations which can be accessed in lieu of defective normal memory locations, is controlled by a redundancy control circuit with a built-in self test (BIST) capability. Responsive to a memory access circuit, the redundant memory provides access to one of a first memory location and a second, redundant memory location responsive to an address generated by the memory access circuit and to a redundancy control signal generated by a self-testing redundancy control circuit. The self-testing redundancy control circuit is operative to apply a redundancy control signal to the redundant memory in response to a comparison of test data stored in a target memory location of the redundant memory with data retrieved from the target memory location.

By providing a BIST capability in an integrated circuit memory device, the present invention can obviate the need for wafer-stage testing. Accordingly, devices can be tested after packaging and other handling that can generate additional defects after wafer fabrication. Because irreversible devices such as fuses are not used, repairs can be reversed.

In particular, according to the present invention, an integrated circuit memory device includes a memory access circuit operative to generate an address. A redundant memory is responsive to the memory access circuit and has a plurality of memory locations, the redundant memory providing access to one of a first memory location and a second memory location responsive to an address generated by the memory access circuit and to a redundancy control signal. A self-testing redundancy control circuit is responsive to the memory access circuit and to the redundant memory and operative to apply a redundancy control signal to the redundant memory in response to a comparison of test data stored in a target memory location of the redundant memory with data retrieved from the target memory location.

In an embodiment of the present invention, the self-testing redundancy control circuit includes a built-in self-test (BIST) control circuit operative to identify a defective addressable memory location in the redundant memory. The BIST control circuit may be operative to apply a test address and corresponding test data to a target location of the memory and to retrieve data stored in the target memory location. The BIST control circuit may apply a test address and corresponding test data responsive to a mode control signal. The mode control signal may be generated in response to application of power to the memory device.

In another embodiment, the BIST control circuit is operative to identify an address of a defective memory location in the memory in response to a comparison of test data applied to the defective memory location to data retrieved from the defective memory location. The BIST control circuit may be operative to generate a defective memory location address corresponding to the identified defective memory location. The self-testing redundancy control circuit may include a redundancy control signal generating circuit responsive to the BIST control circuit and to the memory access circuit and operative to generate a redundancy control signal based on an address generated by the memory access circuit and a defective memory location address generated by the BIST control circuit.

Related operating methods are also discussed.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. As will be appreciated by those skilled in the art, the present invention may be embodied as methods or devices.

Figure 1:
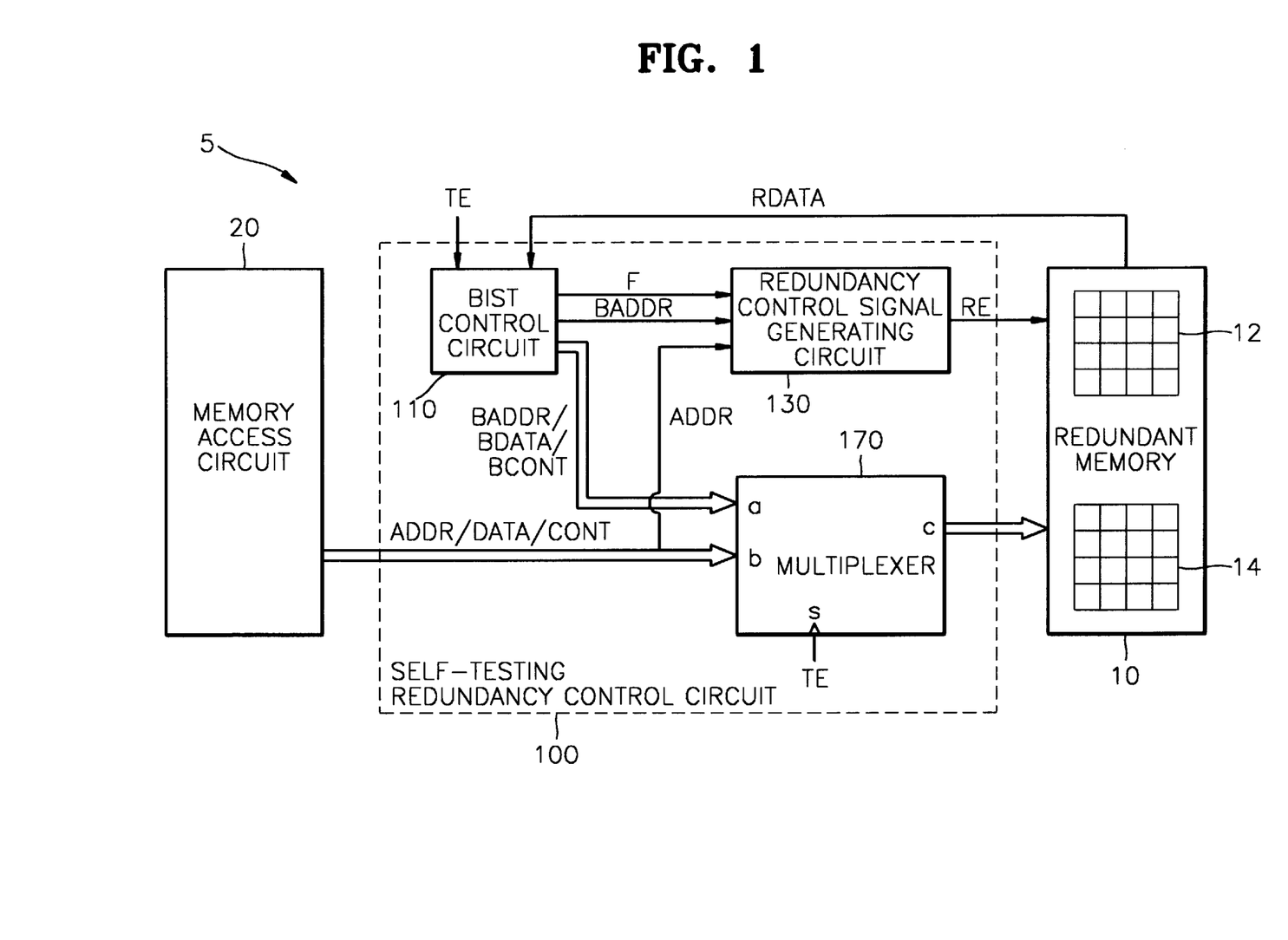
FIG. 1 is a schematic diagram illustrating an embodiment of an integrated circuit memory device according to the present invention.

FIG. 1 illustrates an embodiment of an integrated circuit memory device 5 according to the present invention, including a memory access circuit 20, a redundant memory 10, and a self-testing redundancy control circuit 100. The redundant memory 10 includes a plurality of memory locations, including "normal" memory locations 12 and redundant memory locations 14. The memory access circuit 20 is operative to address the redundant memory 10, generating an address ADDR, as well as data and control signals DATA, CONT. Under control of a self-testing redundancy control circuit 100, the redundant memory 10 provides access to one of a first memory location or a second, redundant memory location therein, based on the address ADDR supplied by the memory access circuit 20 and a redundancy control signal RE generated by the self-testing redundancy control circuit 100.

The self-testing redundancy control circuit 100 includes built-in self-test (BIST) control circuit 110, a redundancy control signal generating circuit 130 and a multiplexer 170. In a BIST mode enabled by a mode control signal TE, the BIST control circuit 110 generates signals for testing the redundant memory 10, e.g., a target address BADDR, test data BDATA and control signals BCONT. In the BIST mode, the BIST control circuit 110 writes the test data BDATA to a target location of the memory 10, reads data RDATA from the target location and compares the test data BDATA with the read data RDATA. The BIST control circuit 110 generates an error signal F if the read test data RDATA does not match the test data BDATA, and supplies the target address BADDR to the redundancy control signal generating circuit 130.

A multiplexer 170 receives address, data and control signals from the BIST control circuit 110 and the memory access circuit 10 at first and second input ports a, b, respectively. Responsive to the mode control signal TE applied to a mode control input s, the multiplexer 170 applies one of the inputs at the first and second input ports a, b to the redundant memory 10 to thereby control access to memory locations in the redundant memory 10. In the BIST mode, the multiplexer 170 applies the address, data and control signals BADDR, BDATA, BCONT generated by the BIST control circuit 110 to the memory 10. When in a non-BIST mode, the multiplexer 170 applies the address, data and control signals ADDR, DATA and CONT generated by the memory access circuit 20 to the memory 10.

In response to the error signal F, the redundancy control signal generating circuit 130 stores the address BADDR of a defective location. The redundancy control signal generating circuit 130 is also responsive to an address generated by the memory access circuit 20, and compares the stored addresses of defective locations identified during BIST operations with the address ADDR generated by the memory access circuit 20. If the address ADDR is generated by the memory access circuit 20 matches a stored address BADDR of a defective location, a redundancy control signal RE is asserted which causes the redundant memory 10 to provide access to a redundant location therein instead of to the normal location associated with the input address ADDR.

Figure 2:
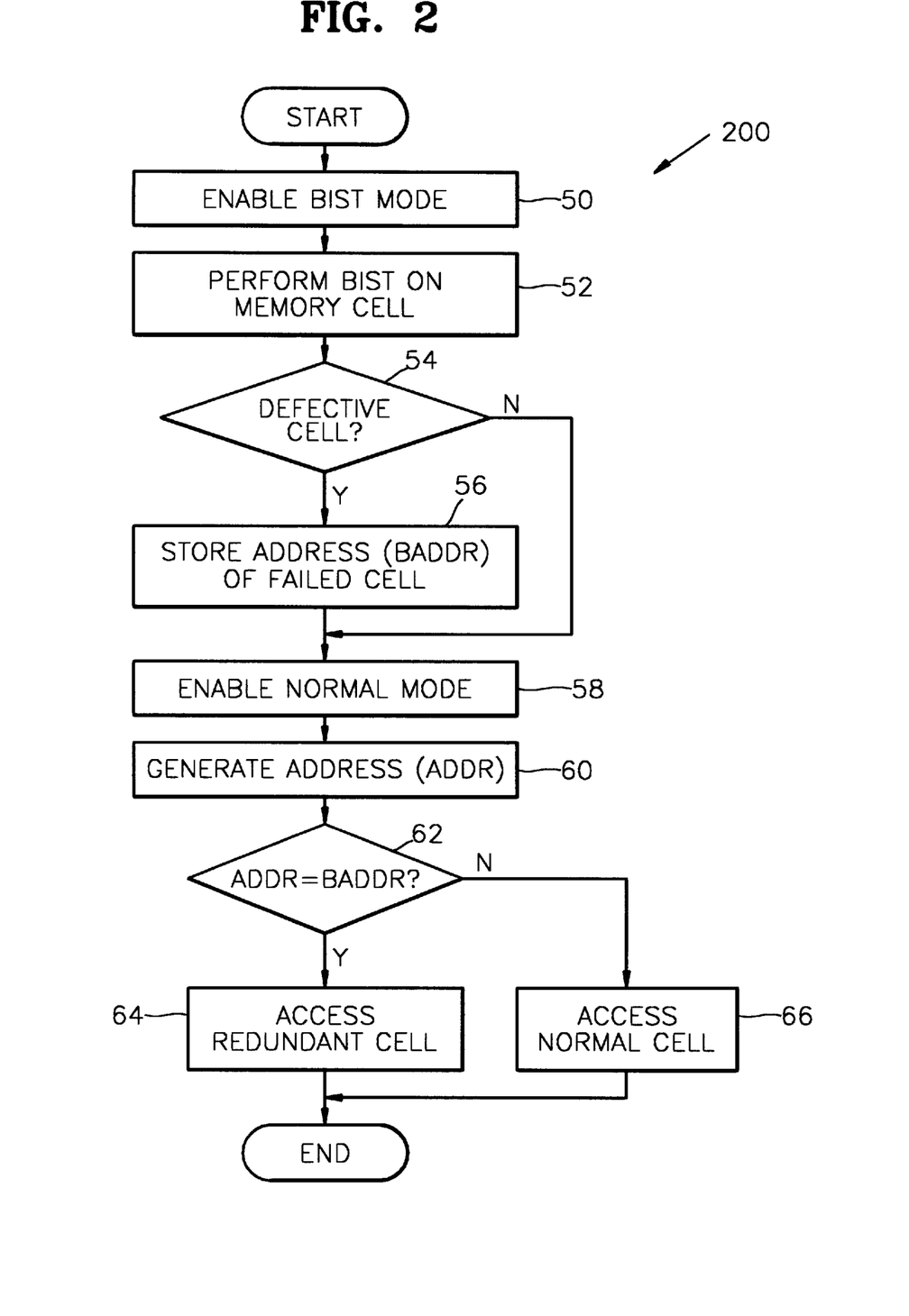
FIG. 2 is a flow chart illustration of exemplary built-in self-test (BIST) operations for the integrated circuit memory device of FIG. 1.

FIG. 2 illustrates exemplary operations 200 for an integrated memory circuit such as that described with respect to FIG. 1. The BIST mode of the integrated circuit device is entered (Block 50), e.g., by creating a particular state of the mode control signal TE. The BIST control circuit 110 performs a series of BIST operations (Block 52). The BIST operations may include, for example, generating BIST address, data and control signals BADDR, BDATA and BCONT to write test data BDATA to a target memory location, subsequently reading data RDATA from the target memory location, and comparing the read data RDATA with the input test data BDATA. If the comparison identifies a defective memory location (Block 54), the corresponding address is stored (Block 56).

After the memory device is placed into a normal, non-BIST mode (Block 58), the memory access circuit generates address, data and control signals ADDR, DATA and CONT to access a desired location in the memory 10 (Block 60). If the address ADDR generated by the memory access circuit 20 matches an address BADDR stored in the redundancy control circuit 130 (Block 62), a redundant location is accessed in lieu of the normal location corresponding to the input address ADDR (Block 64). Otherwise, the normal location is accessed (Block 66).

Figure 3:
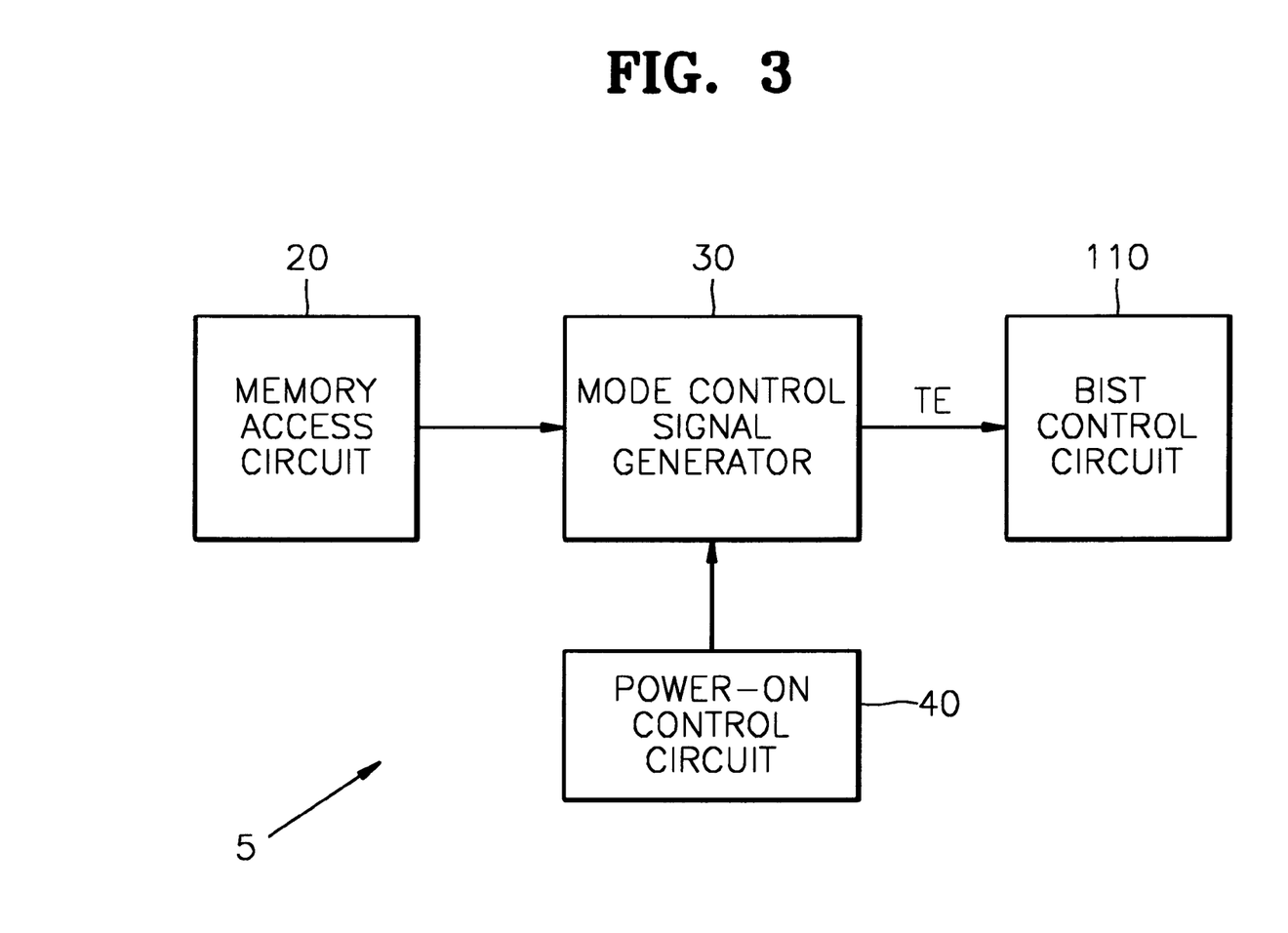
FIG. 3 is a schematic diagram illustrating an embodiment of a mode control circuit for controlling a redundancy control circuit according to an aspect of the present invention.

According to an aspect of the present invention, BIST operations are performed responsive to power-up of the integrated circuit memory device. As illustrated in FIG. 3, the integrated circuit memory device 5 includes a mode control signal generator 30 which generates a mode control signal TE responsive to the memory access circuit 20 and a power-on control circuit 40. Responsive to the power-on control circuit 40, the mode control signal TE places the integrated circuit memory device 5 into a BIST mode, for example, when power is first applied to the device 5.

Figure 4:
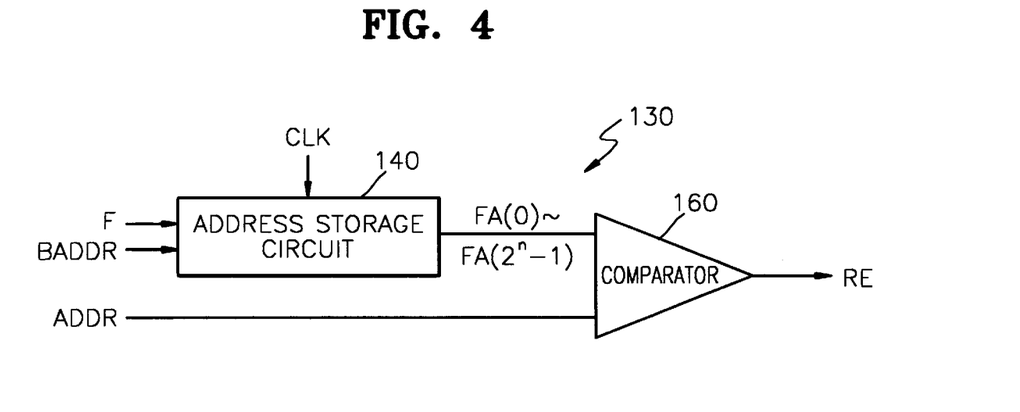
FIG. 4 is a schematic diagram illustrating a circuit for generating a redundancy control signal according to an aspect of the present invention.

An embodiment of a redundancy control signal generating circuit 130 is illustrated in FIG. 4. The redundancy control signal generating circuit 130 includes an address storage circuit 140 that is responsive to an error signal F generated by the BIST control circuit 110 of FIG. 1 to store an address BADDR identified by the BIST control circuit 110. Stored addresses FA(0)–FA($2^n$-1) are compared to an address ADDR generated by the memory is access circuit 20 in a comparator 160 that produces the redundancy control signal RE. The comparator 160 preferably includes the same number ($2^n$) of comparator units as the stored addresses.

Figure 5:
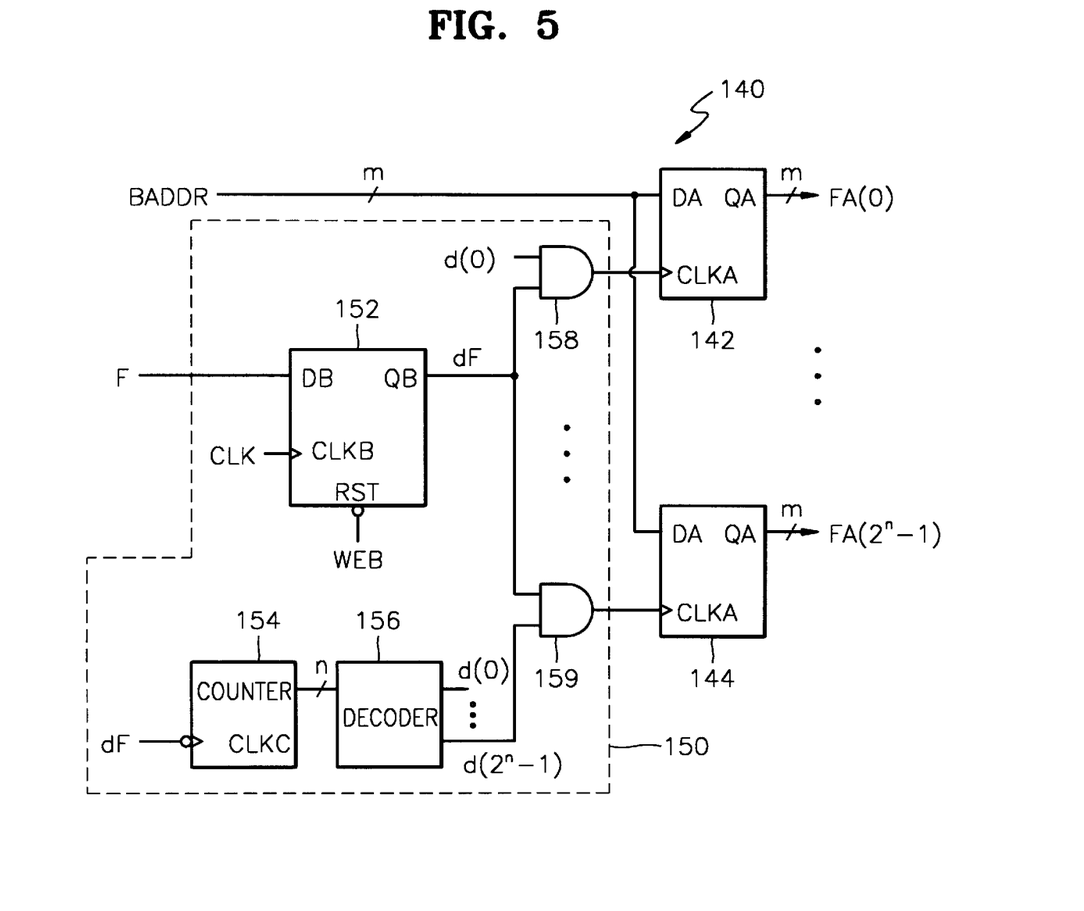
FIG. 5 is a schematic diagram illustrating an embodiment of an address storage circuit according to an aspect of the present invention.

FIG. 5 illustrates an embodiment of an address storage circuit 140. A plurality of registers 142, 144, e.g., flip-flops. Each of the registers 142, 144 is preferably formed of the same number m of cells as number of bits constituting of the addresses BADDR output from the BIST control circuit 110 of FIG. 1. Each of the D-flip-flops 142, 144 has a data input DA, a clock input CLKA and a data output QA. The BIST control circuit generated addresses BADDR are provided at the data inputs DA, and a control signal for sequentially designating a register for storing the repair address whenever the error signal is generated is provided as the clock input CLKA. The data output QA generates the BIST address BADDR supplied to the data input DA in response to a signal applied to a clock input CLKA.

A clock input signal generator 150 generates the signals applied to the clock inputs CLKA of the flip-flops 142, 144. As shown, the clock input signal generator 150 includes a flip-flop 152, e.g., a D-flip-flop, a counter 154, a decoder 156 and logic gates 158, 159. The flip-flop 152 has a data input DB, a clock input CLKB, a reset input RST, and a data output QB. The error signal F output from the BIST control circuit 110 of FIG. 1 is provided to the data input DB. Also, a clock signal CLK is provided to the clock input CLKB, and a write enable signal WEB is provided to the reset input RST. The data output QB of the flip-flop 152 generates a delayed control signal dF in response to the clock signal CLK. The control signal dF is provided to first inputs of the logic gates 158, 159.

The counter 154 is preferably an n-bit binary counter having a clock input CLKC. The control signal dF output from the flip-flop 152 is provided to the clock input CLKC, clocking an n-bit count supplied to the decoder 156. Outputs d(0)–d($2^n$-1) of the decoder 156 are provided to the second inputs of the logic gates 158, 159. When the control signal dF generated by the flip-flop 152 is activated and one of the outputs d(0)–d($2^n$-1) of the decoder 156 is activated to logic "high", one of the logic gates 158, 159 goes to a logic high state. As the outputs d(0)–d($2^n$-1) of the decoder 156 are sequentially activated in synchronization with the falling edge of the control signal dF, the logic gates 158, 159 are sequentially activated. The outputs of the logic gates 158, 159 are provided to the clock input ports CLKA of the D-flip-flops 142, 144.

Figure 6:
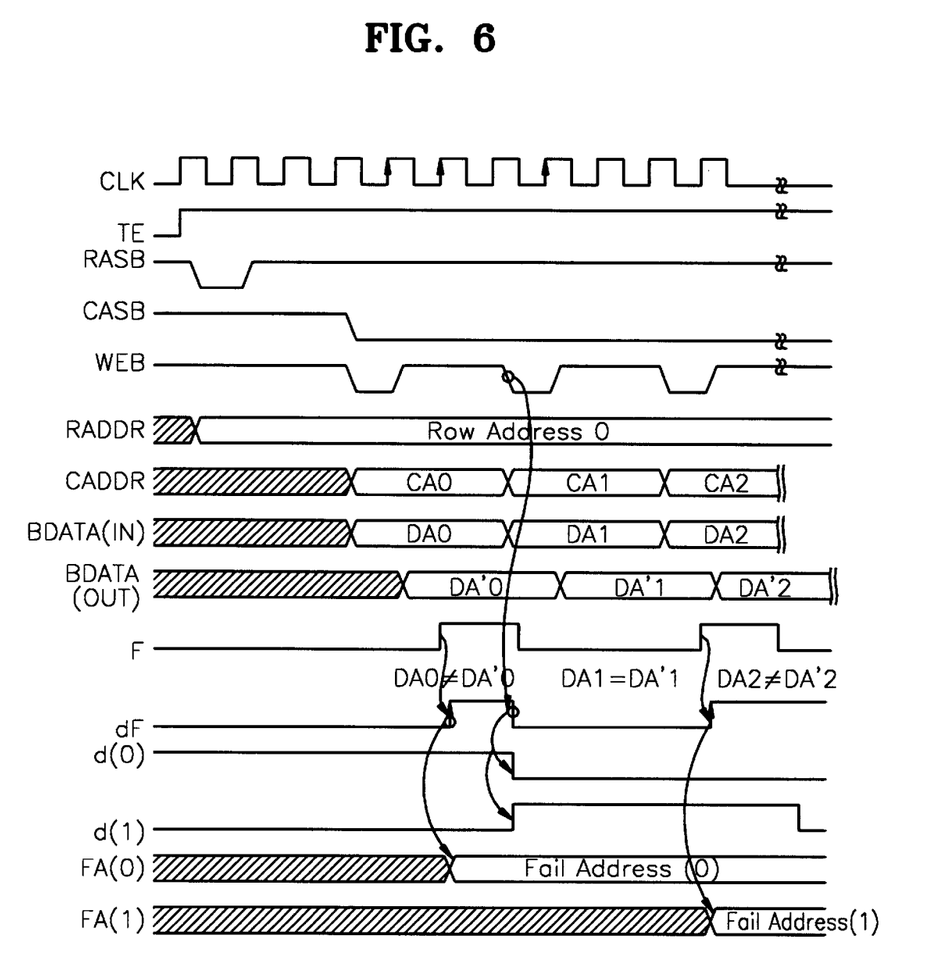
FIG. 6 is a timing diagram illustrating exemplary operations of an integrated circuit memory device with self-testing redundancy capability according to the present invention.

FIG. 6 is a timing diagram illustrating exemplary signal states for the integrated circuit memory device 5 of FIGS. 1 and 4–5. The memory device enters a BIST mode when the mode control signal TE goes high. A row address RADDR and a column address CADDR are generated in response to a row address strobe signal RASB and a column address strobe signal CASB input in synchronization with a clock signal CLK. If a write enable signal WEB is at logic low, test data BDATA is written as test data DA0–DA2. If the write enable signal WEB changes is at logic high, the written test data BDATA is read out as data DA'0–DA'2. If the written data DA0–DA2 are different from the read-out data DA'0–DA'2, the error signal dF goes to logic high after the rising edge of the error signal F.

The control signal dF changes to logic low when the write enable signal WEB returns to logic low. The first output signal d(0) of the decoder 156 shown in FIG. 5 is maintained at a logic high state during an initial period in which the control signal dF is in a low state, and changes to logic low in response to the falling edge of the control signal dF.

The row address RADDR and the column address CADDR input to the address storage circuit 140 of FIG. 5 are stored as defective location addresses when the control signal dF goes from logic low to logic high. In response to the transition of the control signal dF to logic high while the first output signal d(0) of the decoder 156 is maintained at a high level, the input row address RA0 and the first column address CA0 are stored as a first defective location address FA(0). In response to the transition of the control signal dF to logic high while the second output signal d(1) of the decoder 156 is maintained at a high level, the input row address RA0 and the third column address CA2 are stored as a second defective location address FA1.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit memory device, comprising:
   a memory access circuit operative to generate an address;
   a redundant memory having a plurality of memory locations, said redundant memory providing access to one of a first memory location or a second memory location responsive to an address applied thereto, wherein one of the first or second memory locations is accessed based on a redundancy control signal applied to said redundant memory; and
   a self-testing redundancy control circuit configured to receive addresses from said memory access circuit and having normal and built in self test (BIST) modes commanded by a mode control signal, said self-testing redundancy control circuit operative to apply a received address to said redundant memory in said normal mode and to apply an internally generated test address to said redundant memory in said BIST mode, said self-testing redundancy control circuit operative to apply said redundancy control signal to said redundant memory based on a received address in said normal mode.

2. A memory device according to claim 1, wherein said self-testing redundancy control circuit comprises a built-in self test (BIST) control circuit operative to identify a defective addressable memory location in said redundant memory.

3. A memory device according to claim 1, wherein said self-testing redundancy control circuit comprises a BIST control circuit operative to apply a test address and corresponding test data to a target location of said memory and to retrieve data stored in said target memory location.

4. A memory device according to claim 3, wherein said BIST control circuit applies a test address and corresponding test data responsive to said mode control signal.

5. A memory device according to claim 4, wherein said mode control signal has one of a BIST mode state and a normal mode state, and wherein said BIST control circuit applies a test address and corresponding data when said mode control signal is in said BIST mode state.

6. A memory device according to claim 4, further comprising a mode control signal generating circuit operative to generate said mode control signal.

7. A memory device according to claim 5, wherein said mode control signal generating circuit generates a mode control signal having a BIST mode state responsive to application of power to the integrated circuit memory device.

8. A memory device according to claim 3, wherein said BIST control circuit is operative to identify an address of a defective memory location in said memory in response to a comparison of test data applied to said defective memory location to data retrieved from said defective memory location.

9. A memory device according to claim 7:
   wherein said BIST control circuit is operative to generate an defective memory location address corresponding to the identified defective memory location; and
   wherein said self-testing redundancy control circuit comprises a redundancy control signal generating circuit responsive to said BIST control circuit and to said memory access circuit and operative to generate a redundancy control signal based on an address generated by said memory access circuit and a defective memory location address generated by said BIST control circuit.

10. A memory device according to claim 8:
    wherein said BIST control circuit is operative to generate an error signal in response to identification of a defective memory location; and
    wherein said redundancy control signal generating circuit is operative to store a defective memory location address corresponding to the identified defective memory location in response to the error signal.

11. A memory device according to claim 4, wherein said self-testing redundancy control circuit comprises a multiplexer responsive to said memory access circuit and to said BIST control circuit and operative to apply one of an address generated by said memory access circuit and a test address generated by said BIST control circuit responsive to the mode control signal.

12. In an integrated circuit memory device including a redundant memory having a plurality of memory locations, the redundant memory providing access to one of a first memory location or a second memory location responsive to an address applied thereto, access to one of the first or second memory locations being based on a redundancy control signal applied to the redundant memory, a method of operating comprising the steps of:
    applying a test address corresponding to a target memory location of the redundant memory to the redundant memory;
    applying test data to the target memory location;
    reading data from the target memory location;
    storing the test address if the read data fails to match the test data;
    generating an address corresponding to the target memory location;
    comparing the generated address to the stored test address; setting the redundancy control signal to one of a first state or a second state based on the comparison of the generated address to the stored address while applying the generated address to the redundant memory to thereby access one of the target memory location of the redundant memory or a memory location of the redundant memory other than the target memory location.

13. A method according to claim 12, wherein said steps of applying a test address are performed responsive to application of power to the integrated circuit device.

* * * * *

UNITED STATES PATENT AND TRADEMARK OFFICE
CERTIFICATE OF CORRECTION

PATENT NO. : 6,091,649

DATED : July 18, 2000

INVENTOR(S) : Yong Jin Choi

It is certified that error appears in the above-identified patent and that said Letters Patent is hereby corrected as shown below:

Column 8, line 19 after "address;" begin a new paragraph with "setting the redundancy. . ."

Signed and Sealed this

Seventeenth Day of April, 2001

Attest:

NICHOLAS P. GODICI

Attesting Officer     *Acting Director of the United States Patent and Trademark Office*